United States Patent
Torii

(10) Patent No.: US 11,820,068 B2
(45) Date of Patent: Nov. 21, 2023

(54) IMPRINT APPARATUS AND ARTICLE MANUFACTURING METHOD

(71) Applicant: CANON KABUSHIKI KAISHA, Tokyo (JP)

(72) Inventor: Hirotoshi Torii, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 212 days.

(21) Appl. No.: 17/321,832

(22) Filed: May 17, 2021

(65) Prior Publication Data

US 2021/0370578 A1    Dec. 2, 2021

(30) Foreign Application Priority Data

Jun. 2, 2020    (JP) .................................. 2020-096336

(51) Int. Cl.
*B29C 59/02*    (2006.01)
*G03F 7/00*    (2006.01)
*B29C 33/42*    (2006.01)

(52) U.S. Cl.
CPC ............ *B29C 59/02* (2013.01); *B29C 33/424* (2013.01); *G03F 7/0002* (2013.01)

(58) Field of Classification Search
CPC . B29C 59/02; B29C 59/023; B29C 2043/025; B29C 33/424; G03F 7/0002
See application file for complete search history.

(56) References Cited

U.S. PATENT DOCUMENTS

| | | | |
|---|---|---|---|
| 2012/0086149 A1* | 4/2012 | Yoshida | G03F 7/0002 264/293 |
| 2012/0193832 A1* | 8/2012 | Torii | G03F 7/0002 264/293 |
| 2013/0300031 A1* | 11/2013 | Torii | B29C 59/026 264/293 |
| 2016/0288403 A1* | 10/2016 | Schumaker | G03F 7/0002 |
| 2017/0248843 A1* | 8/2017 | Seki | B29C 59/02 |

FOREIGN PATENT DOCUMENTS

JP    5454160 B2    3/2014
JP    6019685 B2    11/2016

* cited by examiner

*Primary Examiner* — Jerzi H Moreno Hernandez
(74) *Attorney, Agent, or Firm* — ROSSI, KIMMS & McDOWELL LLP

(57) ABSTRACT

An imprint apparatus that forms a pattern of an imprint material on a substrate using a mold is described. The apparatus includes a measurement unit that measures one of a displacement and a position of a second surface opposite to a first surface on a side of a pattern region of the mold in a portion of the mold. The portion includes the pattern region and is deformed into a convex shape toward a side of the substrate upon bringing the imprint material on the substrate and the pattern region into contact with each other. The apparatus also includes a control unit that controls a distance between the mold and the substrate based on a measurement value of the measurement unit, such that a shape of the pattern region is kept constant upon curing the imprint material.

10 Claims, 7 Drawing Sheets

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

With an increasing demand for the miniaturization of a semiconductor device, a MEMS (Micro Electro Mechanical System), and the like, in addition to a conventional photolithography technique, an imprint technique has received attention. The imprint technique is a microfabrication technique of molding an imprint material on a substrate using a mold to form a pattern of the imprint material on the substrate. According to the imprint technique, a fine structure on the order of several nm can be formed on a substrate.

In the imprint technique, one example of the method of curing an imprint material is a photo-curing method. The photo-curing method is a method of curing an imprint material by irradiation of light such as ultraviolet light in a state in which the imprint material supplied (arranged) onto a substrate is in contact with a mold, and releasing the mold from the cured imprint material, thereby forming a pattern of the imprint material on the substrate.

In an imprint apparatus that uses such an imprint technique, in addition to microfabrication, a demand for the overlay accuracy between patterns stepwisely formed on a substrate is also increasing. For example, the imprint apparatus is considered to be applied to the manufacture of a semiconductor device having a half pitch of about 32 nm. In this case, according to ITRS (International Technology Roadmap for Semiconductors), an overlay accuracy of 6.4 nm is required. In order to implement such high overlay accuracy, it is necessary to strictly manage the relative positions (horizontal position and vertical position) between the substrate and the mold.

In the imprint apparatus, when the imprint material on the substrate and the mold are brought into contact with each other (the mold is pressed against the imprint material), alignment is performed to align the relative positions of the substrate and the mold. More specifically, alignment in the horizontal direction is implemented by moving the substrate in the horizontal direction with respect to the mold via a substrate stage such that alignment marks provided in both the substrate and the mold overlap each other. Alignment in the vertical direction is implemented by adjusting the pressing force of the mold against the imprint material on the substrate via an actuator that drives the mold in the vertical direction. An alignment error in the horizontal direction causes a shift or a deviation in rotation component, and an alignment error in the vertical direction causes a distortion of the substrate or the mold. Therefore, in the imprint apparatus, it is required to match the relative positions of the substrate and the mold in the order of nm in both the horizontal direction and the vertical direction. Note that for the distortion, the flatness of the holding surface (holding member) that holds each of the substrate and the mold is also an important factor. If the flatness is low, the deformation amount differs between the substrate and the mold, resulting in a decrease in overlay accuracy.

Further, in the imprint apparatus, due to a deformation or a vibration caused by an external force from a drive unit inside the apparatus, a propagation of floor vibration from outside the apparatus, or the like, a relative positional shift may be generated between the holding member that holds the mold and the holding member that holds the substrate. Therefore, it is necessary to keep the high rigidity of the structure of the imprint apparatus.

Furthermore, as the imprint apparatus, it is required to guarantee the high overlay accuracy for a long period of time, so that it is demanded that the alignment accuracy does not change with time.

Therefore, as the technique of controlling (managing) the pressing force of the mold against the imprint material on the substrate, for example, there is a technique of measuring the pressing force from a drive output (current value) of the actuator to control the pressing force. The drive output of the actuator includes the resistance force due to the rigidity of an incorporated component, the preload spring, and the like, and the pressing force of the mold against the imprint material on the substrate. However, if the thrust constant has changed due to the heat of the actuator or a deterioration thereof over time, the relationship between the drive output of the actuator and the pressing force of the mold against the imprint material on the substrate changes. In addition, since a tube, cables, a preload spring, and the like are connected to the holding member (driven side), which holds the mold, and its peripheral member (fixed side), they serve as a driving resistance. If the driving resistance changes with time, it influences the pressing force predicted from the drive output of the actuator, and this causes a decrease in overlay accuracy. Note that the technique of controlling the pressing force of the mold against the imprint material on the substrate is also proposed in each of Japanese Patent Nos. 6019685 and 5454160.

Japanese Patent No. 6019685 discloses a technique of controlling the pressing force of a mold against an imprint material by measuring the local inclination of the mold or the spacing between the mold and the substrate in at least two locations in a region outside a pattern region formed in the convex portion (step structure (mesa)) of the mold. An autocollimator or a laser microscope is used for measurement in at least two locations in the region outside the pattern region of the mold.

However, when measuring the inclination (angle) of the mold with respect to the substrate or the spacing between the mold and the substrate, it is difficult to maintain the accuracy of the measurement on the substrate of an actual device including many patterns (projections and grooves) or having different surface reflection states. In addition, the state of the mold changes in accordance with the thickness and flatness of the mold, a manufacturing error such as the parallelism to the pattern region, a deformation due to the self-weight, and a pressure applied to the cavity (concave portion) provided on the back side of the pattern region. Therefore, it is difficult to accurately control the pressing force of the mold against the imprint material so as to make the mold and the substrate parallel to each other from the measurement result of the inclination of the mold or the spacing between the mold and the substrate.

Japanese Patent No. 5454160 discloses a technique of directly measuring the pressing force of a mold against an imprint material using a pressure sensor provided in a surface of a substrate stage facing the mold. However, in such a technique, since it is necessary to incorporate the pressure sensor in the substrate stage, it is difficult to ensure the flatness of the holding surface that holds the substrate. Further, by providing the pressure sensor in the substrate stage, the rigidity related to the support of the substrate may decrease, and this causes a decrease in overlay accuracy as described above.

SUMMARY OF THE INVENTION

The present invention provides an imprint apparatus advantageous in improving the overlay accuracy.

According to one aspect of the present invention, there is provided an imprint apparatus that forms a pattern of an imprint material on a substrate using a mold, the apparatus including a drive unit configured to drive at least one of the mold and the substrate so as to adjust a distance between the mold and the substrate, a first measurement unit configured to measure one of a displacement and a position of a second surface opposite to a first surface on a side of a pattern region of the mold in a portion of the mold, the portion including the pattern region and being deformed into a convex shape toward a side of the substrate upon bringing the imprint material on the substrate and the pattern region into contact with each other, and a control unit configured to control a drive amount of the drive unit based on a measurement value of the first measurement unit obtained before bringing the imprint material and the pattern region into contact with each other such that a shape of the pattern region is kept constant upon curing the imprint material in a state in which the imprint material and the pattern region are in contact with each other.

Further aspects of the present invention will become apparent from the following description of exemplary embodiments with reference to the attached drawings.

DESCRIPTION OF THE EMBODIMENTS

Figure 1:
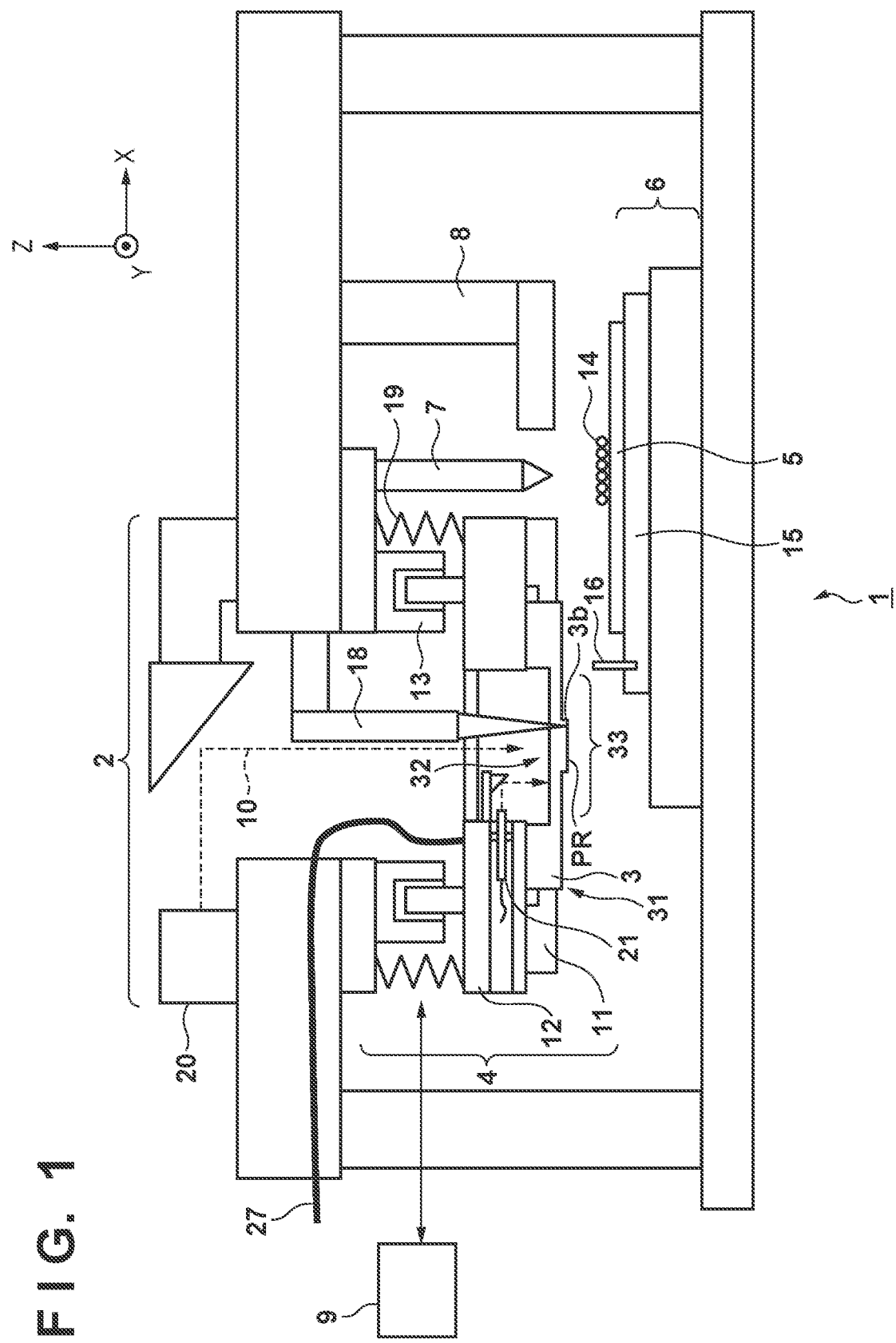
FIG. 1 is a schematic view illustrating configurations of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating configurations of an imprint apparatus 1 according to an aspect of the present invention. The imprint apparatus 1 is a lithography apparatus that is employed in a lithography step, which is a manufacturing step of a device such as a semiconductor device, a liquid crystal display device, a magnetic storage medium, or the like serving as an article, and forms a pattern on a substrate. The imprint apparatus 1 brings an imprint material supplied (arranged) onto a substrate into contact with a mold and applies curing energy to the imprint material, thereby forming a pattern of a cured product to which a pattern of the mold has been transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In this embodiment, the imprint apparatus 1 employs a photo-curing method as the curing method of the imprint material and, as shown in FIG. 1, includes an irradiation unit 2, an imprint head 4, a substrate stage 6, a supply unit 7, a mold conveyance unit 8, and a control unit 9.

In the specification and the accompanying drawings, directions will be indicated by an XYZ coordinate system in which directions parallel to the surface of a substrate 1 are set as the X-Y plane. Directions parallel to the X-axis, the Y-axis, and the Z-axis of the XYZ coordinate system are the X direction, the Y direction, and the Z direction, respectively, and a rotation about the X-axis, a rotation about the Y-axis, and a rotation about the Z-axis are θX, θY, and θZ, respectively. Control or driving (moving) concerning the X-axis, the Y-axis, and the Z-axis means control or driving (moving) concerning a direction parallel to the X-axis, a direction parallel to the Y-axis, and a direction parallel to the Z-axis, respectively. In addition, control or driving concerning the θ X-axis, the θ Y-axis, and the θ Z-axis means control or driving concerning a rotation about an axis parallel to the X-axis, a rotation about an axis parallel to the Y-axis, and a rotation about an axis parallel to the Z-axis, respectively.

The irradiation unit 2 includes a light source 20, and a plurality of optical elements that appropriately adjust light (for example, ultraviolet light) 10 emitted from the light source 20. During an imprint process, the irradiation unit 2 applies the light 10 to an imprint material 14 on a substrate through a mold 3. The light 10 has a function of curing the imprint material 14.

The mold 3 is also referred to as a template or an original, and used to mold the imprint material 14 on the substrate.

The mold 3 is formed of a material (for example, quartz) that can transmit the light 10. The mold 3 has a rectangular outer shape, and includes a front surface (a first surface on the pattern-region side) 31 on which a pattern (for example, a projection and groove pattern such as a circuit pattern) to be transferred to a substrate 5 (imprint material 14 thereon) is formed, and a back surface (second surface) 32 opposite to the front surface 31.

The mold 3 includes, on the front surface 31 facing the substrate 5, a protruding portion 3b protruding toward the substrate side by about several ten µm. The protruding portion 3b (surface thereof) includes a pattern region PR in which the pattern to be transferred to the substrate 5 is three-dimensionally formed. The surface (pattern region PR) of the protruding portion 3b is processed to have a high flatness to maintain the adhesion with the surface of the substrate 5.

In order to form a portion 33 to be deformed into a convex shape toward the substrate side to bring the imprint material 14 on the substrate and the pattern region PR of the mold 3 into contact with each other, a cavity (engraved portion) 3a having a concave shape is provided in the back surface 32 of the mold 3. The portion 33 has a finite (larger than 0 mm) thickness equal to or smaller than, for example, 3 mm.

The imprint head 4 functions as a mold driving unit that holds and drives the mold 3 in the Z-axis direction (vertical direction). The imprint head 4 includes a mold holding member 12 that holds the mold 3, an actuator 13 used to drive the mold holding member 12 (mold 3) in the vertical direction, and a deformation unit 11 that deforms the pattern region PR of the mold 3 held by the mold holding member 12. In the imprint head 4, an incorporated component 27 and a self-weight compensation spring 19 are connected from the mold holding member 12 to the apparatus-fixing side. The incorporated component 27 includes a tube for vacuum-chucking the mold 3, an electric cable that electrically connects the deformation unit 11, and the like.

The mold holding member 12 includes a chuck that chucks and holds the mold 3 by a vacuum-chucking force or an electrostatic force. The actuator 13 drives the mold holding member 12 in the Z-axis direction to bring the mold 3 (pattern region PR thereof) into contact with (press the mold 3 against) the imprint material 14 on the substrate. For example, a linear motor can be employed as the actuator 13, but the present invention is not particularly limited to this. The deformation unit 11 functions as a magnification correction mechanism that deforms the pattern region PR to correct it to a desired shape by applying a force (compression force) to the side surface of the mold 3. A motorized actuator may be used as the deformation unit 11 to apply compression force to the mold.

The substrate 5 is a target processing substrate to which the pattern of the mold 3 is to be transferred. The imprint material 14 is applied (arranged) on the surface of the substrate 5.

The substrate stage 6 can freely drive in the X-Y plane while holding the substrate 5. Note that the substrate stage 6 may have a function as a substrate driving unit that holds and drives the substrate 5 in the Z-axis direction (vertical direction). For example, a linear motor can be employed as an actuator used to drive the substrate stage 6, but the present invention is not particularly limited to this. A substrate holding member 15 that holds the substrate 5 by, for example, vacuum chucking is provided in the substrate stage 6.

The actuator 13 that drives the mold holding member 12 and the actuator that drives the substrate stage 6 form a driving unit that drives at least one of the mold 3 and the substrate 5 so as to adjust the distance between the mold 3 and the substrate 5. Adjustment of the distance between the mold 3 and the substrate 5 may be implemented by driving the mold 3 (mold holding member 12) in the Z-axis direction as in this embodiment, but may be implemented by driving the substrate 5 (substrate stage 6) in the Z-axis direction. Alternatively, adjustment of the distance between the mold 3 and the substrate 5 may be implemented by relatively driving both the mold 3 and the substrate 5 in the Z-axis direction.

The supply unit 7 has a function of supplying the uncured imprint material 14 onto the substrate. For example, the supply unit 7 includes a dispenser that discharges droplets of the imprint material 14 to the substrate 5. The imprint material 14 has a property of being cured by receiving the light 10 applied from the irradiation unit 2, and the imprint material 14 is appropriately selected in accordance with the type of a device to be manufactured.

The mold conveyance unit 8 conveys the mold 3 between a mold storage unit that stores the mold 3 and the mold holding member 12 (imprint head 4).

The control unit 9 may be provided in the imprint apparatus 1, or may be provided in a location different from the imprint apparatus 1. The control unit 9 is formed by an information processing apparatus (computer) including a CPU, a memory, and the like, and controls the entire imprint apparatus 1 in accordance with a program stored in a storage unit. The control unit 9 performs an imprint process of forming a pattern of an imprint material in each of a plurality of shot regions on a substrate by controlling the respective units of the imprint apparatus 1.

In the imprint process, the imprint material 14 is supplied from the supply unit 7 onto the substrate, the spacing between the mold 3 and the substrate 5 is decreased, and the mold 3 (pattern region PR) is brought into contact with (pressed against) the imprint material 14. Then, in a state in which the imprint material 14 on the substrate and the mold 3 are in contact with each other, the irradiation unit 2 applies the light 10 to the imprint material 14 to cure the imprint material 14. Thereafter, the spacing between the mold 3 and the substrate 5 is increased to release the mold 3 from the cured imprint material 14 on the substrate, thereby transferring the pattern of the mold 3 to the imprint material 14 on the substrate. By performing such a series of processing on each of the plurality of shot regions on the substrate, the pattern of the imprint material 14 is formed in each of the shot regions.

In the imprint process, when bringing the imprint material 14 on the substrate and the mold 3 into contact with each other, alignment for matching the relative positions of the substrate 5 and the mold 3 is performed under the control of the control unit 9. In the alignment in the X-axis direction and the Y-axis direction (horizontal directions), alignment marks provided in both the substrate 5 and the mold 3 are measured by an alignment scope 18, and the alignment is performed by driving the substrate stage 6 such that the alignment marks overlap each other.

As shown in FIG. 1, the imprint apparatus 1 also includes a first measurement unit 21. In this embodiment, the first measurement unit 21 is provided in the mold holding member 12, and measures the position of the cavity 3a of the mold 3 in the Z-axis direction (vertical direction) and the position thereof in the X-axis direction and the Y-axis direction (horizontal directions) perpendicular to the Z-axis direction. More specifically, the first measurement unit 21 measures the displacement or position of the back surface 32 in the portion 33 of the mold 3.

As the first measurement unit 21, a laser interferometer capable of measurement at nm level is preferable, but the present invention is not limited to this. For example, a laser displacement meter, a capacitive displacement meter, an encoder, or the like may be used as the first measurement unit 21. Note that when an encoder is used as the first measurement unit 21, it is required to provide a scale (or grid) in the cavity 3a.

As shown in FIG. 1, the imprint apparatus 1 further includes a second measurement unit 16. The second measurement unit 16 is provided in the substrate stage 6, and measures the Z-axis direction position of the mold held by the mold holding member 12, more specifically, the displacement or position of the front surface 31 of the mold 3. The second measurement unit 16 can measure an arbitrary position of the mold 3 by driving the substrate stage 6. Similar to the first measurement unit 21, a laser displacement meter, a capacitive displacement meter, an encoder, or the like may be used as the second measurement unit 16.

Figure 2:
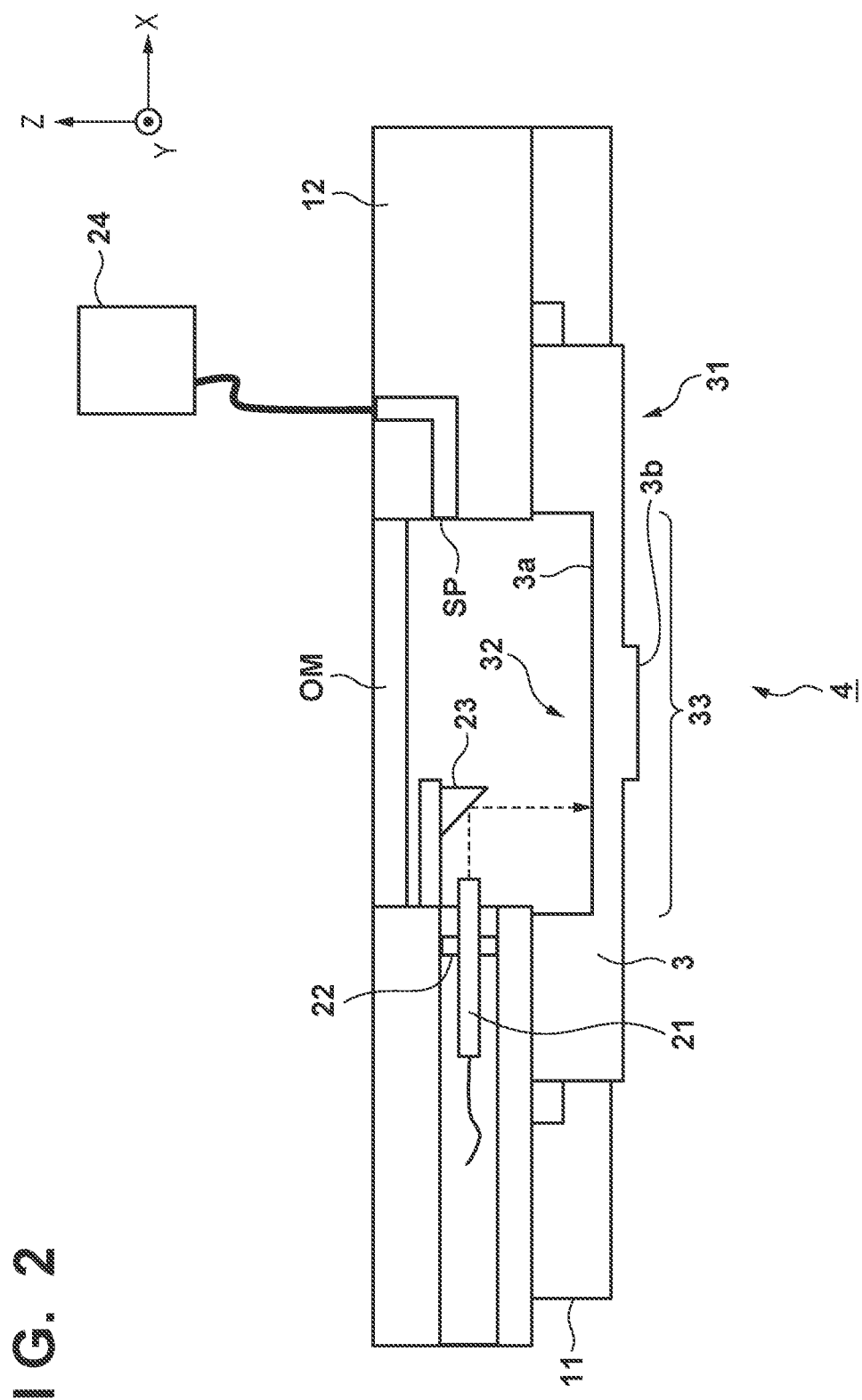
FIG. 2 is a view showing the arrangement in the vicinity of a mold holding member in detail.

FIG. 2 is a view showing the arrangement in the vicinity of the mold holding member 12 in detail. As shown in FIG. 2, the first measurement unit 21 is supported in (inside) the mold holding member 12 via a supporting unit 22. Due to the limitation of the arrangement space, the first measurement unit 21 is arranged such that its measurement axis is directed in the horizontal direction. Therefore, a deflecting mirror 23 for changing the measurement axis to the Z-axis direction is provided to enable the first measurement unit 21 to measure the displacement or position of the back surface 32 in the portion 33 of the mold 3 from the Z-axis direction. The supporting unit 22 has a structure of sealing a space SP to be described later.

Further, as shown in FIG. 2, a pressure adjustment unit 24 is connected to the space SP defined by the cavity 3a provided in the mold 3 and an optical member OM provided in the opening portion (hollow portion) of the mold holding member 12. The pressure adjustment unit 24 can deform the portion 33 of the mold 3 by adjusting the pressure in the space SP so as to increase or decrease the pressure applied to the back surface 32 of the mold 3 (that is, adjust the pressure applied to the back surface 32 of the mold 3). For example, the pressure adjustment unit 24 increases the pressure in the space SP to deform the portion 33 of the mold 3 into a convex shape toward the substrate side. In this state, the imprint material 14 on the substrate and the pattern region PR of the mold 3 are brought into contact with each other. With this operation, a time (filling time) required to fill the imprint material 14 on the substrate into the pattern (groove) of the mold 3 can be shortened. Note that the pressure in the space SP is measured by a pressure sensor (not shown).

With reference to FIGS. 3A to 3F, an operation (imprint process) of the imprint apparatus 1 according to this embodiment will be described. As has been described above, the imprint apparatus 1 is operated by the control unit 9 comprehensively controlling the respective units of the imprint apparatus 1.

Figure 3A:
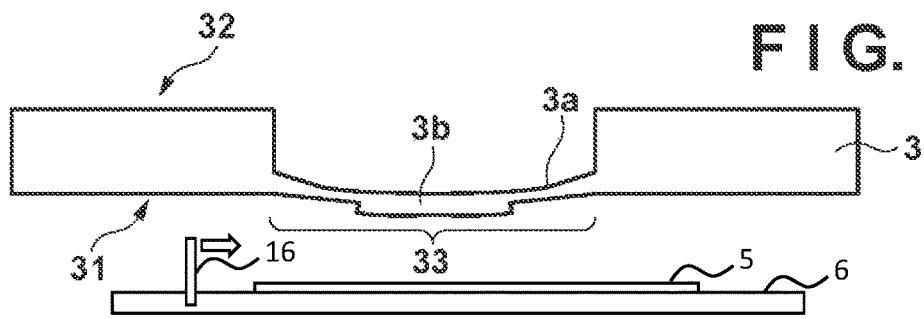
FIGS. 3A to 3F are views for describing an operation of the imprint apparatus.

First, as shown in FIG. 3A, the front surface 31 of the mold 3 held by the mold holding member 12 is measured by the second measurement unit 16 provided in the substrate stage 6. For example, while the substrate stage 6 is driven, the second measurement unit 16 measures the difference between a region where the cavity 3a of the mold 3 exists and a region where the cavity 3a of the mold 3 does not exist, that is, the displacement (bending amount) of the portion 33 of the mold 3.

Figure 3B:
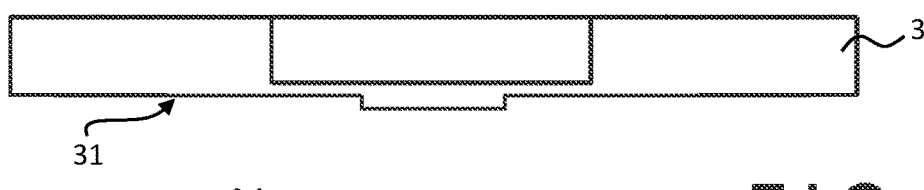

Then, as shown in FIG. 3B, based on the measurement value of the second measurement unit 16, the pressure adjustment unit 24 adjusts (controls) the pressure in the space SP defined by the cavity 3a of the mold 3 and the optical member OM. In other words, based on the measurement value of the second measurement unit 16 obtained before bringing the imprint material 14 on the substrate and the pattern region PR of the mold 3 into contact with each other, the pressure to be applied to the back surface 32 of the mold 3 by the pressure adjustment unit 24 to deform the portion 33 of the mold 3 into a convex shape toward the substrate side is adjusted. More specifically, the pressure is adjusted so as to minimize the difference between the region where the cavity 3a of the mold 3 exists and the region where the cavity 3a does not exist, that is, so as to set the deformation (displacement) of the portion 33 of the mold 3 to zero. After the pressure adjustment unit 24 adjusts the pressure in the space SP, the second measurement unit 16 may measure the displacement of the portion 33 of the mold 3 again to check whether the displacement of the portion 33 of the mold 3 falls within an allowable range.

Figure 3C:
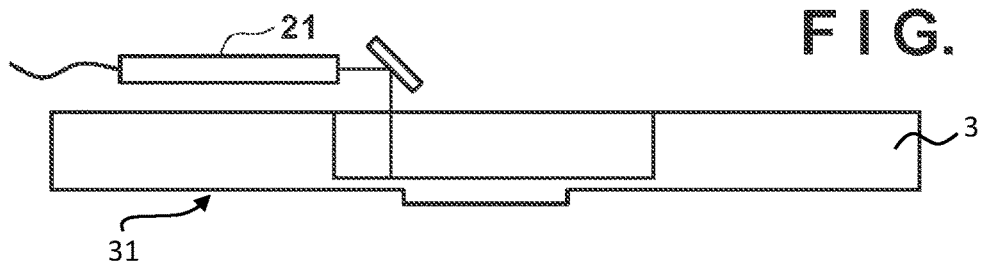

Next, as shown in FIG. 3C, before bringing the imprint material 14 on the substrate and the pattern region PR of the mold 3 into contact with each other, the first measurement unit 21 measures the position of the cavity 3a of the mold 3, that is, the displacement of the back surface 32 in the portion 33 of the mold 3. Here, a measurement value obtained by the first measurement unit 21 is a measurement value of the first measurement unit 21 obtained before bringing the imprint material 14 and the pattern region PR into contact with each other, and a measurement value of the first measurement unit 21 in a state in which the pressure adjustment unit 24 has adjusted the pressure in the space SP. The processing shown in FIGS. 3A and 3B aims to cancel the initial state of the mold 3, for example, the bending of the mold 3 due to the deformation of the mold 3 caused by the self-weight or holding thereof, a pressure adjustment error of the pressure adjustment unit 24, or the like. Therefore, if it is unnecessary to cancel the bending of the mold 3, instead of the processing shown in FIGS. 3A and 3B, the process may be started from processing shown in FIG. 3C in a state in which the pressure in the space SP is simply set to the atmospheric pressure, that is, the gauge pressure is set to zero.

Figure 3D:
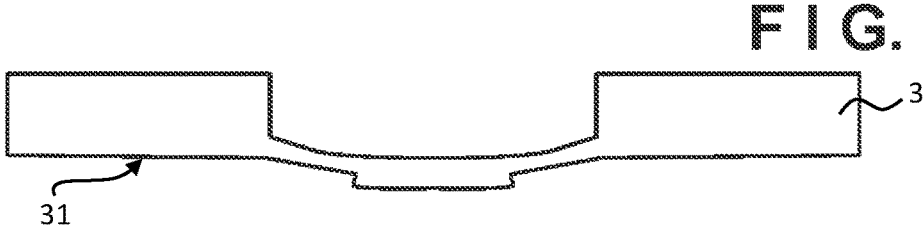

Then, as shown in FIG. 3D, the pressure in the space SP defined by the cavity 3a and the optical member OM is increased by the pressure adjustment unit 24 so as to deform the portion 33 of the mold 3 into a convex shape toward the substrate side.

Figure 3E:
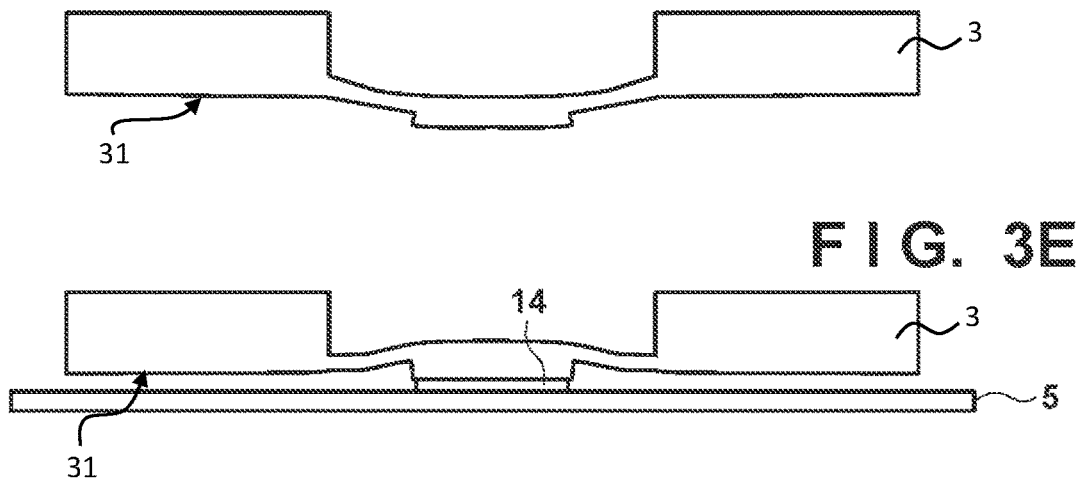

Next, as shown in FIG. 3E, the imprint material 14 on the substrate and the pattern region PR of the mold 3 are brought into contact with each other. At this time, the pattern region PR of the mold 3 is pressed against the imprint material 14 on the substrate by a predetermined force (for example, several ten N). The pressing force of the mold 3 against the imprint material 14 on the substrate may be controlled so as to match a target value by converting the measurement value of the first measurement unit 21, or may be controlled such that the current value of the actuator 13 matches a target value. With this operation, the imprint material 14 on the substrate is filled into the pattern (groove) of the mold 3.

Figure 3F:
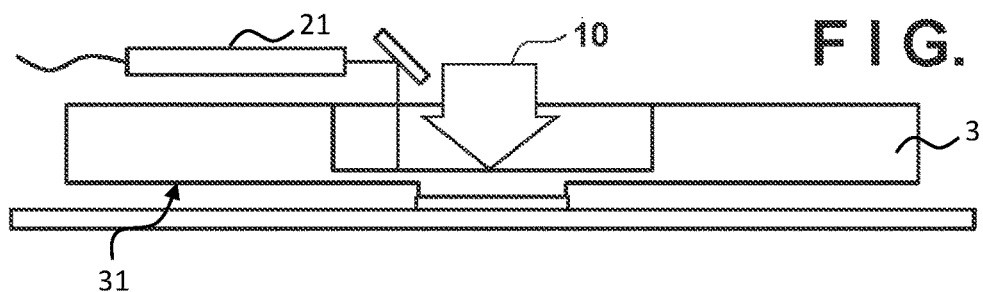

Then, as shown in FIG. 3F, the pressure in the space SP defined by the cavity 3a and the optical member OM is recovered (that is, set to the state shown in FIG. 3B), and the position of the cavity 3a of the mold 3, that is, the displacement of the back surface 32 in the portion 33 of the mold 3 is measured by the first measurement unit 21. Then, the pressing force of the mold 3 against the imprint material 14 on the substrate is adjusted (controlled) such that the measurement value obtained by the first measurement unit 21 in the state shown in FIG. 3F matches the measurement value obtained by the first measurement unit 21 in the state shown in FIG. 3C. This pressing force is adjusted using the distance between the mold 3 and the substrate 5. In this embodiment, the drive amount of the actuator 13 (imprint head 4) is used. By matching the measurement value obtained by the first measurement unit 21 in the state shown in FIG. 3F with the measurement value obtained by the first measurement unit 21 in the state shown in FIG. 3C, the shape (state) of the mold 3 can be set to the state shown in FIG. 3E. This is equivalent to being capable of reproducing the state in which the pressing force of the mold 3 against the imprint material 14 on the substrate is close to zero and the portion 33 (pattern region PR) of the mold 3 has no distortion.

After matching the measurement value obtained by the first measurement unit 21 in the state shown in FIG. 3F with the measurement value obtained by the first measurement unit 21 in the state shown in FIG. 3C, the light 10 from the irradiation unit 2 is applied to the imprint material 14 on the substrate through the mold 3. With this operation, the imprint material 14 on the substrate is cured, and by releasing the mold 3 from the cured imprint material 14, a pattern of the imprint material 14 is formed on the substrate.

As has been described above, in this embodiment, upon curing the imprint material 14 in the state in which the imprint material 14 on the substrate and the pattern region PR of the mold 3 are in contact with each other, the drive amount of the actuator 13 is controlled so as to keep the shape of the pattern region PR constant. At this time, the drive amount of the actuator 13 is controlled based on the measurement value of the first measurement unit 21 obtained before bringing the imprint material 14 on the substrate and the pattern region PR into contact with each other. For example, it is controlled such that the difference between the measurement value (FIG. 3C) of the first measurement unit 21 obtained before bringing the imprint material 14 and the pattern region PR into contact with each other and the measurement value (FIG. 3F) of the first measurement unit 21 obtained after bringing the imprint material 14 and the pattern region PR into contact with each other falls within an allowable range. More specifically, it is controlled such that the measurement value (FIG. 3F) of the first measurement unit 21 obtained after bringing the imprint material 14 and the pattern region PR into contact with each other matches the measurement value (FIG. 3C) of the first measurement unit 21 obtained before bringing the imprint material 14 and the pattern region PR into contact with each other. With this operation, in the imprint apparatus 1, it is possible to cure the imprint material 14 on the substrate in a state in which the distortion of the portion 33 (pattern region PR) of the mold 3 is minimum, so that the pattern of the mold 3 can be transferred onto the substrate with high accuracy. At this time, in this embodiment, no load cell is required to measure the pressing force of the mold 3 against the imprint material 14 on the substrate, so a decrease in rigidity of the apparatus and a decrease in flatness of the holding surface do not occur. In addition, since the pressing force of the mold 3 against the imprint material 14 on the substrate (the drive amount of the actuator 13) is controlled based on the displacement of the mold 3, it is not influenced by an external disturbance caused by the resistance of the incorporated component 27, a current change of the actuator 13, or the like. Further, it is possible to control the pressing force of the mold 3 against the imprint material 14 on the substrate so as to decrease the distortion of the portion 33 of the mold 3 without directly measuring the relative position and parallelism between the mold 3 and the substrate 5. Therefore, in the imprint apparatus 1 according to this embodiment, it is possible to improve the overlay accuracy between patterns stepwisely formed on the substrate.

Note that in this embodiment, it has been described that the first measurement unit 21 and the second measurement unit 16 measure the displacement regarding the mold 3 in the imprint process shown in FIGS. 3A to 3F, but the present invention is not limited to this. For example, the first measurement unit 21 and the second measurement unit 16 may measure the position regarding the mold 3, and the imprint process shown in FIGS. 3A to 3F may be performed using the measurement value.

The first measurement unit 21 may also be used to periodically monitor the pressure adjustment accuracy of the pressure adjustment unit 24 (that is, calibrate the pressure adjustment unit 24) under the control of the control unit 9. The control unit 9 also functions as a calibration unit that calibrates the pressure adjustment unit 24 using the first measurement unit 21. For example, the control unit 9 calibrates the pressure adjustment unit 24 based on the difference between the measurement value of the first measurement unit 21 obtained when the pressure adjustment unit 24 applies a reference pressure to the back surface 32 of the mold 3 and an ideal value to be measured by the first measurement unit 21 when the pressure adjustment unit 24 applies the reference pressure to the back surface 32 of the mold 3. With this operation, it is possible to more strictly control the deformation of the mold 3 (portion 33 thereof) generated when the pressure adjustment unit 24 applies a pressure to the back surface 32 of the mold 3.

Note that it is also possible to use the second measurement unit 16 to calibrate the pressure adjustment unit 24. For example, the pressure adjustment unit 24 may be calibrated based on the difference between the measurement value of the second measurement unit 16 obtained when the pressure adjustment unit 24 applies the reference pressure to the back surface 32 of the mold 3 and an ideal value to be measured by the second measurement unit 16 when the pressure adjustment unit 24 applies the reference pressure to the back surface 32 of the mold 3.

When the pattern region PR (portion 33) of the mold 3 is deformed by the deformation unit 11, the pattern region PR is also deformed into a convex shape toward the substrate side in accordance with the force applied to the side surface of the mold 3 from the deformation unit 11, so that the pattern region PR is also displaced in the Z-axis direction. Accordingly, depending on the magnitude of the force applied to the side surface of the mold 3 from the deformation unit 11, the drive amount of the actuator 13 (the pressing force of the mold 3 against the imprint material 14) required to minimize the distortion of the portion 33 of the mold 3 in FIG. 3F changes. Therefore, even if the measurement value of the first measurement unit 21 obtained in the state shown in FIG. 3F is matched with the measurement value of the first measurement unit 21 obtained in the state shown in FIG. 3C, the state in which the portion 33 (pattern region PR) of the mold 3 has no distortion is not necessarily obtained. In such a case, the displacement of the pattern region PR in the Z-axis direction is calculated from the deformation amount of the pattern region PR of the mold 3 generated by the deformation unit 11 and, while taking the displacement into account, the drive amount of the actuator 13 may be controlled such that the state in which the portion 33 of the mold 3 has no distortion is obtained. For example, if the pattern region PR of the mold 3 is reduced by 1 ppm by the deformation unit 11, the drive amount of the actuator 13 is controlled such that the measurement value of the first measurement unit 21 is increased by several ten nm (the mold 3 is spaced apart from the first measurement unit 21 by several ten nm).

Figure 4B:
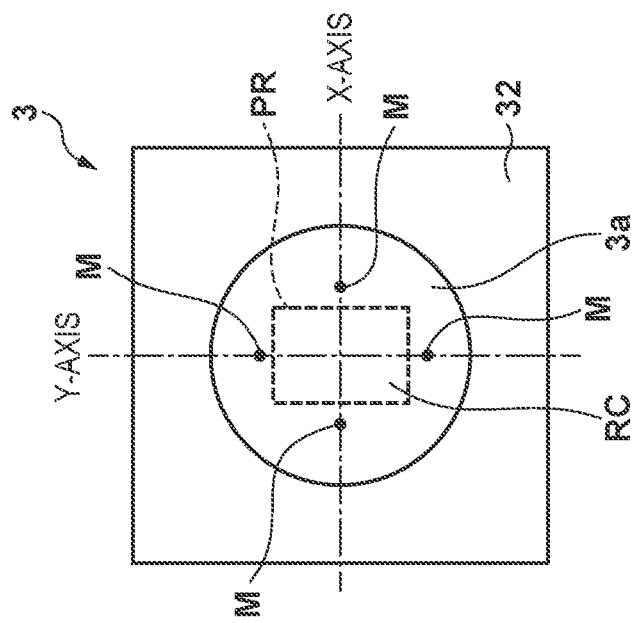
FIGS. 4A and 4B are views each for describing measurement points of a first measurement unit.
Figure 4A:
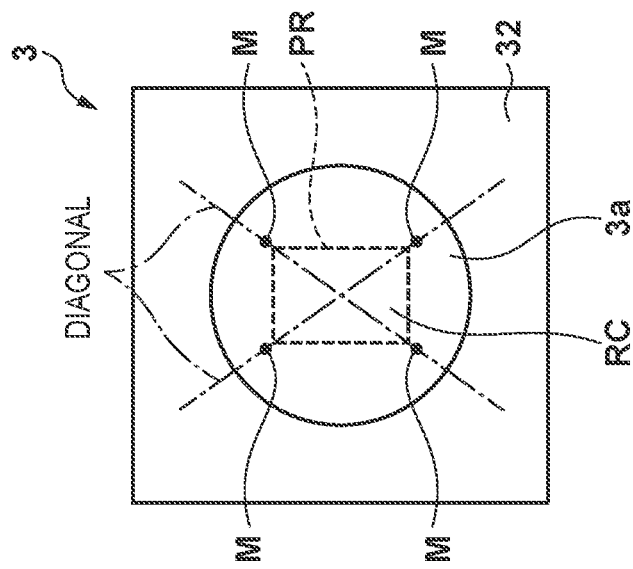

Here, with reference to FIGS. 4A and 4B, locations (measurement points) on the back surface 32 of the mold 3 to be measured by the first measurement unit 21 will be more specifically described. In this embodiment, the pattern region PR of the mold 3 has a rectangular shape as shown in each of FIGS. 4A and 4B. In this case, as shown in FIG. 4A, at least two locations that are located in a region of the back surface 32 outside a rectangular region RC obtained by projecting the pattern region PR onto the back surface 32 of the mold 3 and located on one of two diagonals of the rectangular region RC are set as measurement points M of the first measurement unit 21. Alternatively, as shown in FIG. 4B, at least two locations that are located in the region of the back surface 32 outside the rectangular region RC and located on one of two straight lines each passing through the center of the rectangular region RC and parallel to a side of the rectangular region RC may be set as the measurement points M of the first measurement unit 21. In this manner, by measuring at least two locations in the region outside the rectangular region RC of the back surface 32 of the mold 3 by the first measurement unit 21 to obtain measurement values, the distortion of the portion 33 (pattern region PR) of the mold 3 can be obtained, and the distortion can be corrected.

As shown in FIGS. 5A to 5D, the first measurement unit 21 may measure the width of the mark M provided in the back surface 32 in the portion 33 (cavity 3a) of the mold 3. The mark M is a mark different from the alignment mark used for alignment between the mold 3 and the substrate 5, and is provided in a boundary portion (outside the boundary) of the rectangular region (projection region) RC obtained by projecting the pattern region PR onto the back surface 32 of the mold 3. The mark M is provided in the region of the back surface 32 outside the rectangular region RC and on the diagonal of the rectangular region RC or on a straight line passing through the center of the rectangular region RC and parallel to a side of the rectangular region RC. The mark M may be formed by a groove or a protrusion, or may be formed by surface processing including coating.

Figure 5D:
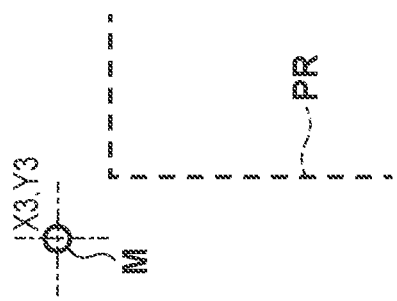
FIGS. 5A to 5D are views each showing an example of a mark provided in the back surface of a mold.
Figure 5B:
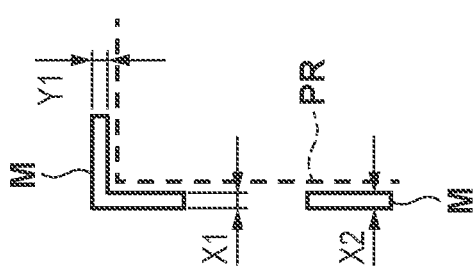
Figure 5C:
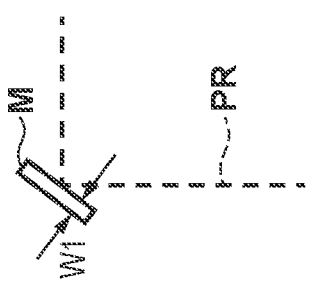
Figure 5A:
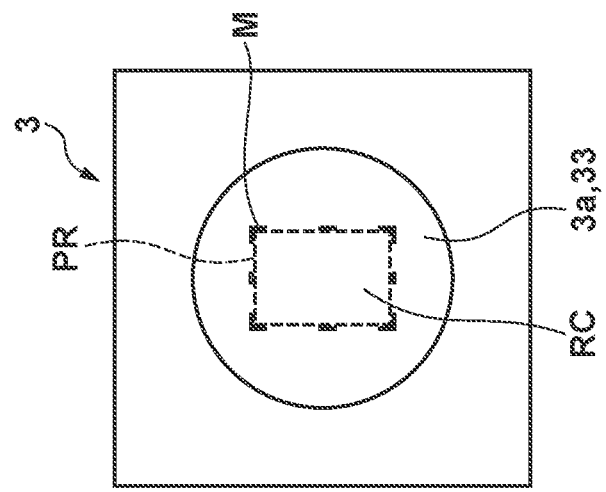

For example, as shown in FIG. 5B, the first measurement unit 21 measures the X-axis direction width and Y-axis direction width of the mark M provided in the back surface 32 of the mold 3, more specifically, widths X1, Y1, and X2 of the marks M. Alternatively, as shown in FIG. 5C, the first measurement unit 21 may measure the diagonal direction width of the mark M provided in the back surface 32 of the mold 3, more specifically, a width W1 of the mark M. As shown in FIG. 5D, the first measurement unit 21 may measure widths (X-axis direction diameter and Y-axis direction diameter) X3 and Y3 of the mark M having a circular shape. Note that the mark M has the circular shape in FIG. 5D, but the present invention is not limited to this, and the mark M may have, for example, a cross shape.

When the imprint material 14 on the substrate and the pattern region PR of the mold 3 are brought into contact with each other, a large displacement is generated in the boundary of the protruding portion 3b, so that the width of the mark M provided in the vicinity thereof changes. Therefore, by measuring the change in width of the mark M by the first measurement unit 21, it is possible to adjust the pressing force of the mold 3 against the imprint material 14 on the substrate. Based on the width of the mark M measured by the first measurement unit 21 before bringing the imprint material 14 on the substrate and the pattern region PR into contact with each other, the drive amount of the actuator 13 is controlled such that the shape of the pattern region PR is kept constant upon curing the imprint material 14. For example, it is controlled such that the difference between the measurement value of the first measurement unit 21 (the width of the mark M) obtained before bringing the imprint material 14 and the pattern region PR into contact with each other and the measurement value of the first measurement unit 21 obtained after bringing the imprint material 14 and the pattern region PR into contact with each other falls within an allowable range. More specifically, it is controlled such that the measurement value of the first measurement unit 21 obtained after bringing the imprint material 14 and the pattern region PR into contact with each other matches the measurement value of the first measurement unit 21 obtained before bringing the imprint material 14 and the pattern region PR into contact with each other. With this operation, in the imprint apparatus 1, it is possible to cure the imprint material 14 on the substrate in a state in which the distortion of the portion 33 (pattern region PR) of the mold 3 is minimum, so that the overlay accuracy can be improved.

Figure 6:
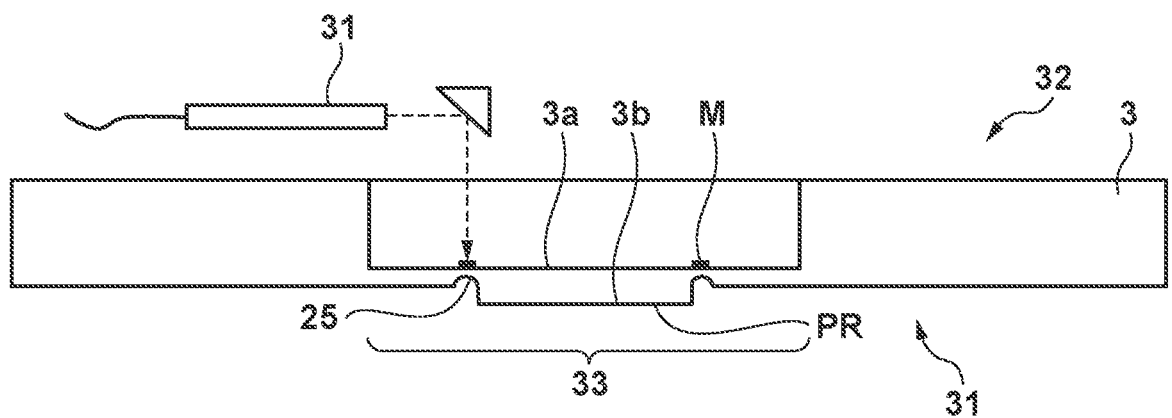
FIG. 6 is a sectional view showing an example of the arrangement of the mold.

Alternatively, as shown in FIG. 6, in the front surface 31 of the mold 3, a groove 25 may be provided, so as to correspond to the mark M provided in the back surface 32, around the protruding portion 3b (pattern region PR), that is, a region obtained by projecting the boundary portion of the rectangular region RC onto the front surface 31. With this arrangement, the change in width of the mark M upon bringing the imprint material 14 on the substrate and the pattern region PR of the mold 3 into contact with each other increases, so that measurement of the change in width of the mark M by the first measurement unit 21 is facilitated. FIG. 6 is a sectional view showing an example of the arrangement of the mold 3.

The pattern of a cured product formed using the imprint apparatus 1 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 7A:
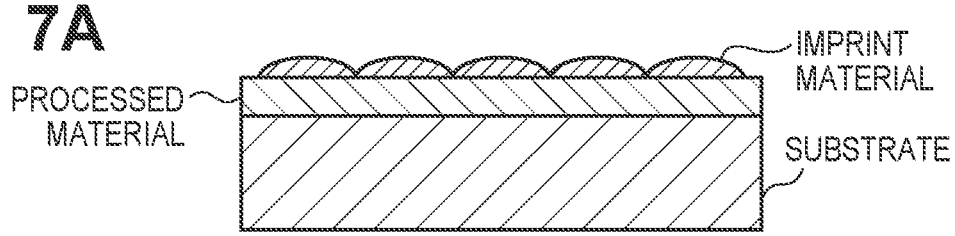
FIGS. 7A to 7F are views for describing an article manufacturing method.

Next, description regarding a detailed method of manufacturing an article is given. As illustrated in FIG. 7A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 7B:
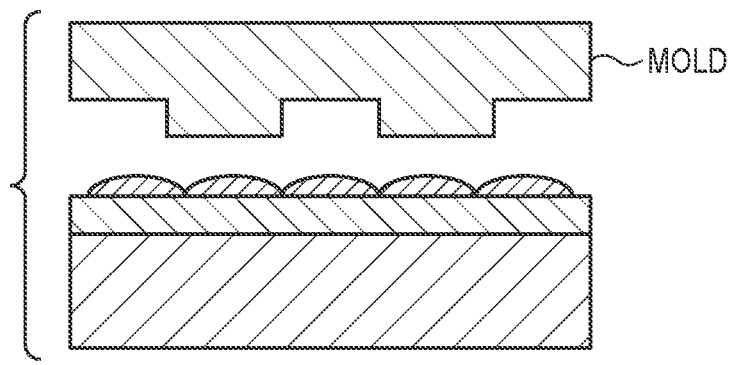
Figure 7C:
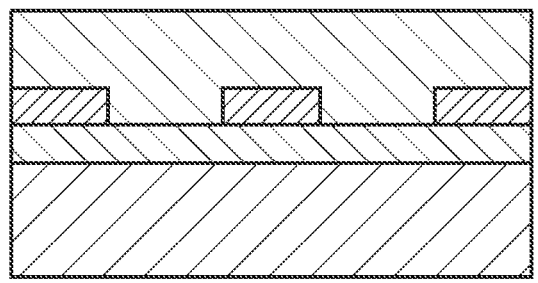

As shown in FIG. 7B, a side of the mold for imprint with a projection and groove pattern formed is directed to and caused to face the imprint material on the substrate. As illustrated in FIG. 7C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 7D:
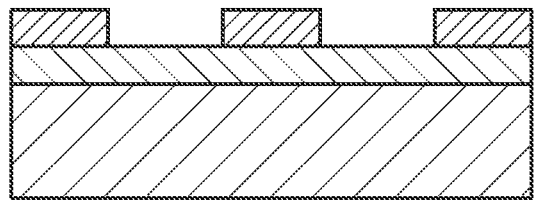

As shown in FIG. 7D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 7E:
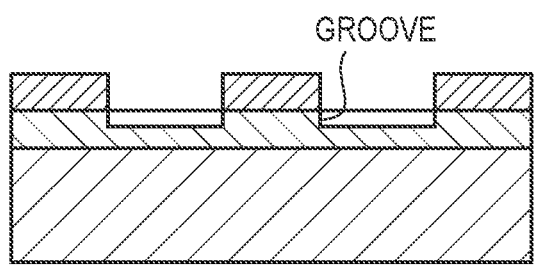
Figure 7F:
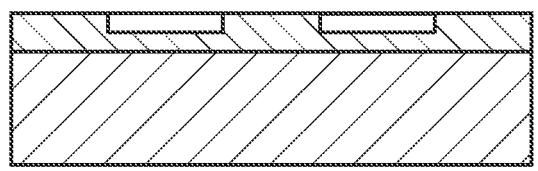

As shown in FIG. 7E, when etching is performed using the pattern of the cured product as an etching resistant mask, a portion of the surface of the processed material where the cured product does not exist or remains thin is removed to form a groove. As shown in FIG. 7F, when the pattern of the cured product is removed, an article with the grooves formed in the surface of the processed material can be obtained. The pattern of the cured product is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-096336 filed on Jun. 2, 2020, which is hereby incorporated by reference herein in its entirety.

What is claimed is:

1. An imprint apparatus comprising:
a mold holding unit configured to hold a mold having a pattern region formed thereon;
a substrate stage configured to hold a substrate having an imprint material provided thereon, the imprint apparatus being configured to form the pattern of the mold on the imprint material;
an adjustment unit configured to adjust a shape of the mold;
a curing unit configured to cure the imprint material;
a drive unit configured to drive at least one of the mold and the substrate so as to adjust a distance between the mold and the substrate;
a first measurement unit configured to measure one of a displacement and a position of a second surface of the mold, opposite to a first surface of the mold on a side of the pattern region of the mold in a portion of the mold, the portion of the mold including the pattern region and being deformed into a convex shape toward a side of the substrate upon bringing the imprint material on the substrate and the pattern region into contact with each other; and
a control unit configured to control a drive amount of the drive unit based on a measurement value of the first measurement unit obtained before bringing the imprint material and the pattern region into contact with each other such that a shape of the pattern region is kept constant upon curing the imprint material in a state in which the imprint material and the pattern region are in contact with each other,
wherein the pattern region has a rectangular shape, and
wherein the first measurement unit is configured to measure one of a displacement and a position of each of at least two locations located in a region of the second surface of the mold outside a rectangular region obtained by projecting the pattern region formed on the first surface of the mold onto the second surface of the mold and located on one of two diagonals of the rectangular region.

2. The apparatus according to claim 1, wherein
the control unit is configured to control the drive amount of the drive unit such that a difference between the measurement value of the first measurement unit obtained before bringing the imprint material and the pattern region into contact with each other and a measurement value of the first measurement unit obtained after bringing the imprint material and the pattern region into contact with each other falls within an allowable range.

3. The apparatus according to claim 1, wherein
the control unit is configured to control the drive amount of the drive unit such that a measurement value of the first measurement unit obtained after bringing the imprint material and the pattern region into contact with each other matches the measurement value of the first measurement unit obtained before bringing the imprint material and the pattern region into contact with each other.

4. The apparatus according to claim 1, wherein
the at least two locations include two locations on both sides of the rectangular region.

5. The apparatus according to claim 1, further comprising:
an adjustment unit configured to adjust a pressure applied to the second surface to deform the portion into a convex shape toward the side of the substrate; and
a second measurement unit configured to measure one of a displacement and a position of the first surface of the mold,
wherein the adjustment unit is configured to adjust the pressure based on a measurement value of the second measurement unit obtained before bringing the imprint material and the pattern region into contact with each other, and
the control unit is configured to control the drive amount of the drive unit based on a measurement value of the first measurement unit obtained in a state in which the pressure is adjusted by the adjustment unit.

6. The apparatus according to claim 5, further comprising a calibration unit configured to calibrate the adjustment unit based on a difference between a measurement value of the first measurement unit obtained when the adjustment unit applies a reference pressure to the second surface and an ideal value to be measured by the first measurement unit when the adjustment unit applies the reference pressure to the second surface.

7. The apparatus according to claim 1, further comprising a deformation unit configured to deform the pattern region by applying a force to a side surface of the mold,
wherein the control unit is configured to control the drive amount of the drive unit also based on one of a displacement and a position of the second surface obtained by deforming the pattern region by the deformation unit.

8. The apparatus according to claim 1, wherein
the mold holding unit is configured to hold and drive the mold in a vertical direction, and the substrate stage is configured to hold and drive the substrate in the vertical direction, and the first measurement unit is provided in the mold holding unit.

9. The apparatus according to claim 1, wherein the portion has a thickness of not more than 3 mm.

10. The apparatus according to claim 1, wherein the second surface of the portion is provided with a cavity having a concave shape used to deform the portion into the convex shape toward the side of the substrate.

* * * * *